(12) United States Patent
Ruckenbauer

(10) Patent No.: US 7,436,195 B2
(45) Date of Patent: Oct. 14, 2008

(54) TEST APPARATUS FOR SEMICONDUCTOR ELEMENTS ON A SEMICONDUCTOR WAFER, AND A TEST METHOD USING THE TEST APPARATUS

(75) Inventor: Friedrich Ruckenbauer, Villach (AT)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 11/736,422

(22) Filed: Apr. 17, 2007

(65) Prior Publication Data

US 2007/0247177 A1    Oct. 25, 2007

(30) Foreign Application Priority Data

Apr. 19, 2006  (DE)  ........................ 10 2006 018 474

(51) Int. Cl.
  *G01R 31/02*  (2006.01)
  *G01R 31/28*  (2006.01)
(52) U.S. Cl. .................................. 324/758; 324/158.1
(58) Field of Classification Search .............. 324/158.1, 324/754–732; 180/116–130
See application file for complete search history.

(56) References Cited

U.S. PATENT DOCUMENTS

| 4,014,576 | A  | * | 3/1977 | Druschel et al. ............... 406/38 |
| 6,756,797 | B2 | * | 6/2004 | Brandorff et al. ........... 324/754 |
| 6,838,896 | B2 | * | 1/2005 | Leedy ........................ 324/760 |
| 6,906,543 | B2 | * | 6/2005 | Lou et al. .................... 324/754 |
| 7,233,438 | B2 | * | 6/2007 | Tokunaga et al. ........... 359/395 |
| 7,242,204 | B2 | * | 7/2007 | Otaguro et al. ............. 324/758 |

* cited by examiner

*Primary Examiner*—Vinh P. Nguyen
*Assistant Examiner*—Joshua Benitez
(74) *Attorney, Agent, or Firm*—Banner & Witcoff, Ltd.

(57) ABSTRACT

A test apparatus for semiconductor elements on a semiconductor wafer has test probes in a test area, which are held by a needle card. The needle card is held by a test area housing which surrounds the test area. Pressure is applied to the test area, and the test area housing floats on an air cushion above the semiconductor wafer. The test area housing has at least three distance sensors, which detect the width of a gap between the test area housing and the semiconductor wafer upper face, and interact with at least three gap control elements. The gap control elements are supported against a stiff test apparatus plate and maintain a predetermined gap width, while the semiconductor wafer is arranged on a test table of the test apparatus.

24 Claims, 6 Drawing Sheets

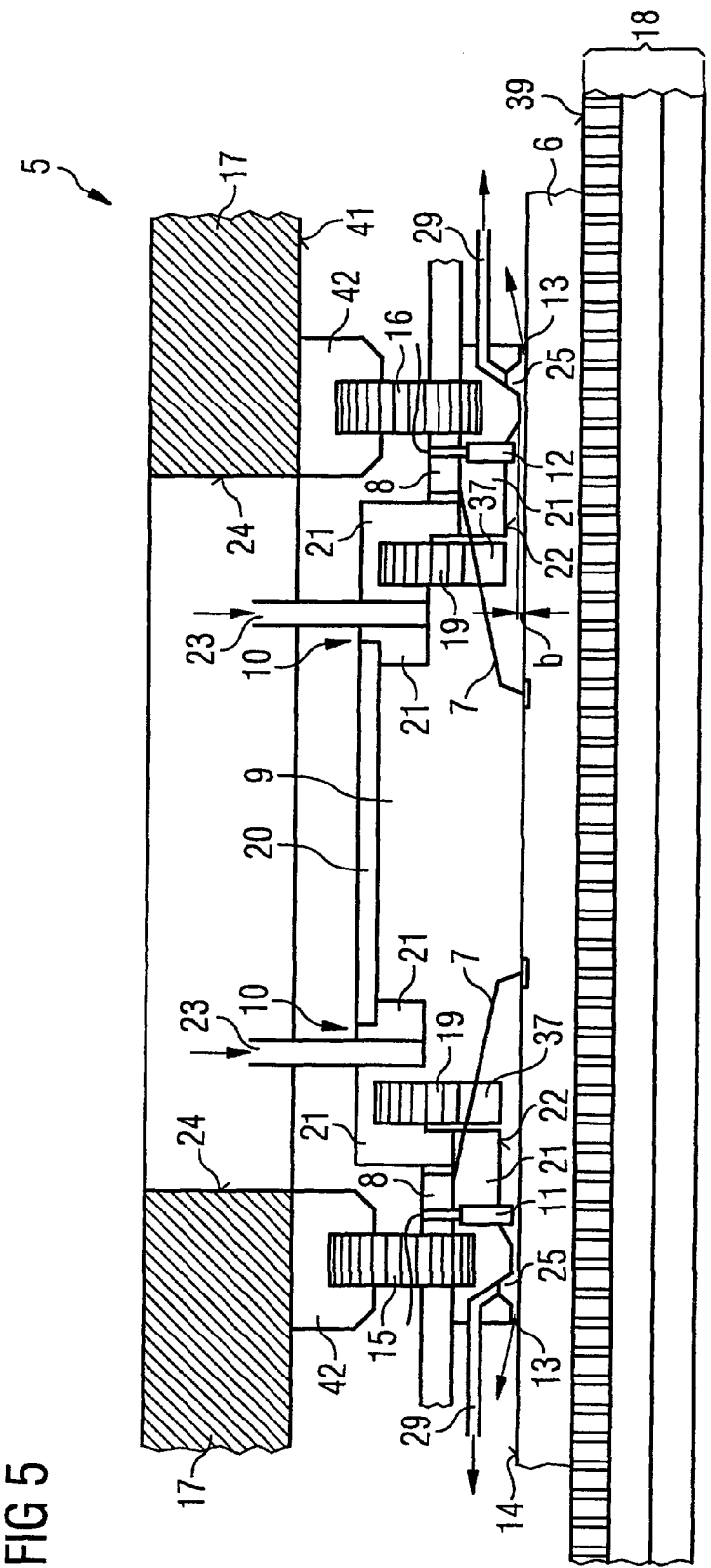

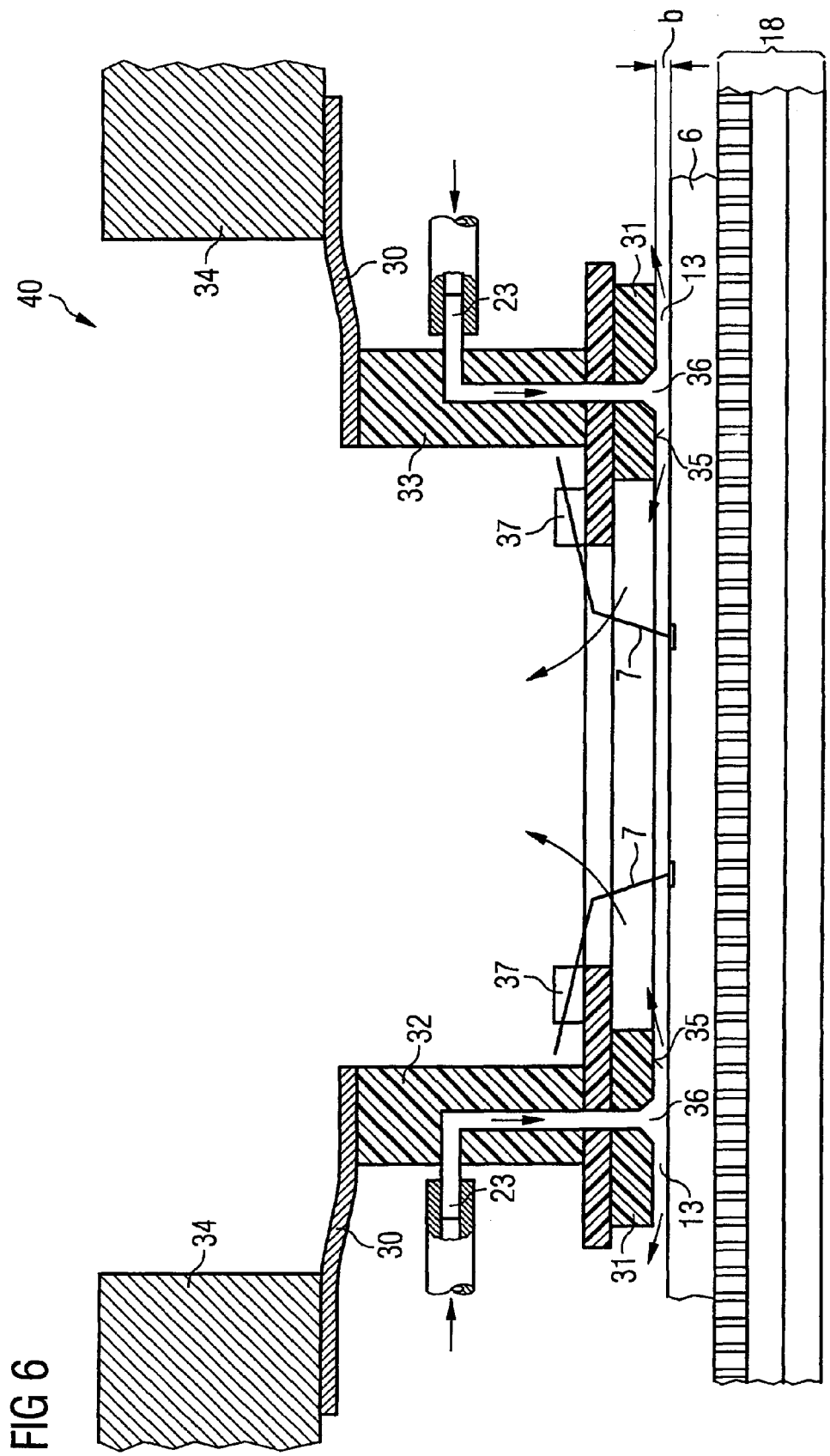

TEST APPARATUS FOR SEMICONDUCTOR ELEMENTS ON A SEMICONDUCTOR WAFER, AND A TEST METHOD USING THE TEST APPARATUS

RELATED APPLICATION

This application claims priority from German Patent Application No. 10 2006 018 474.2, which was filed on Apr. 19, 2006, and is incorporated herein by reference in its entirety.

TECHNICAL FIELD

The invention relates to a test apparatus for semiconductor component structures on a semiconductor wafer having a needle card which holds test probes and having a test area, which surrounds the test probes, within a test housing which has the needle card.

BACKGROUND

One such test apparatus is known from the document JP 2002-22770 A. In this case, the known test apparatus has a needle card which is fitted with a gas supply line, with a gas outlet nozzle forcing a gas flow from outside the test area through a gap between a semiconductor wafer and the test housing into the test area, which is open at the top. In this case, the width of the gap and hence the distance between the test housing and the semiconductor wafer are governed by the gas flow in the gap.

This test apparatus has the disadvantage that there is a risk that an unevenly distributed gas flow in the gas gap can lead to tilting and/or touching on one side, and to damage to the semiconductor wafer surface. In addition, there is a risk of contamination adhering to the semiconductor upper face of the semiconductor wafer, or of particles from the environment being carried into the test area by the gas flow which is carried from the outside inwards. The measurement can thus be corrupted by problems in making contact between the semiconductor component structures and the test probes. Furthermore, there is a risk of the test probes being subject to a non-uniform contact pressure.

A further test apparatus is known from the document JP 2001-281267 A, in which a test area which is covered by a transparent plate is surrounded by a test housing. Nitrogen is forced via a gas inlet into the test area, so that the test probes, which are supported by a needle card, are kept free of contamination in the test area.

One disadvantage of this test apparatus is that the distance between the lower face of the test area housing and the upper face of the semiconductor wafer to be tested is sufficiently large that the gas flow does not carry out any supporting function.

A further conventional test apparatus is shown in FIG. 6. In this test apparatus 40 for semiconductor component structures on a semiconductor wafer 6, a needle card 8 holds test probes 7, with the needle card 8 being supported by a gas cushion ring 31. Supporting elements 32 and 33 hold the needle card 8 in an initial position. The supporting elements 32 and 33 are for this purpose held by spring elements 30, which are supported on a test apparatus frame 34. An annular groove 36 on the lower face of the gas cushion ring 31 is supplied with gas pressure via gas inlets 23, so that the needle card 8 can be supported by the gas cushion ring 31 against the spring effect of the spring elements 30, and a gas gap 13 with a gas gap width b can be maintained between the lower face 35 of the gas cushion ring 31 and the upper face 14 of the semiconductor wafer 6 to be tested.

This test apparatus 40 has the disadvantage that it is impossible to preclude the risk of tilting of the gas cushion ring 31, so that uncontrolled touching of the semiconductor wafer 6 can occur. Furthermore, tilting of the gas cushion ring 31 can dangerously reduce the breakdown strength of the gas gap 13. Furthermore, the gas gap width b is dependent on pressure fluctuations in an annular groove 36 of the gas cushion ring 31. In addition, flow inhomogeneities in the gas gap 13 caused by tilting can result in suction effects on particles from the surrounding area, so that the particles can be drawn from the surrounding area into the test area of the test probes 7. Finally, the resonant system formed from spring elements 30 and supporting elements 32 and 33 with the needle card 8 and the gas cushion ring 31 can be caused to oscillate naturally by the outlet-flow speed in the area of the gas gap 13, which results in increased wear to the test probes 7, reducing the life of the test apparatus 40.

SUMMARY

According to an embodiment, a test apparatus for semiconductor element structures on a semiconductor wafer may comprise a needle card which holds test probes within a test area located within a test area housing holding the needle card, wherein the test area is pressurized such that the test area housing floats on a gas cushion on the semiconductor wafer, wherein the test area housing comprises at least three distance sensors which detect the width of a gap between the test area housing and a semiconductor wafer upper face, and interact with at least three gap control elements, which are supported against a stiff test apparatus plate and maintain a predetermined gap width, and wherein the semiconductor wafer is arranged on a test table of the test apparatus.

BRIEF DESCRIPTION OF THE DRAWINGS

The invention will now be explained in more detail with reference to the attached figures.

FIG. 5 shows a schematic cross section through a fifth embodiment of a test apparatus; and FIG. 6 shows a schematic cross section through a conventional test apparatus.

DETAILED DESCRIPTION

Figure 1:
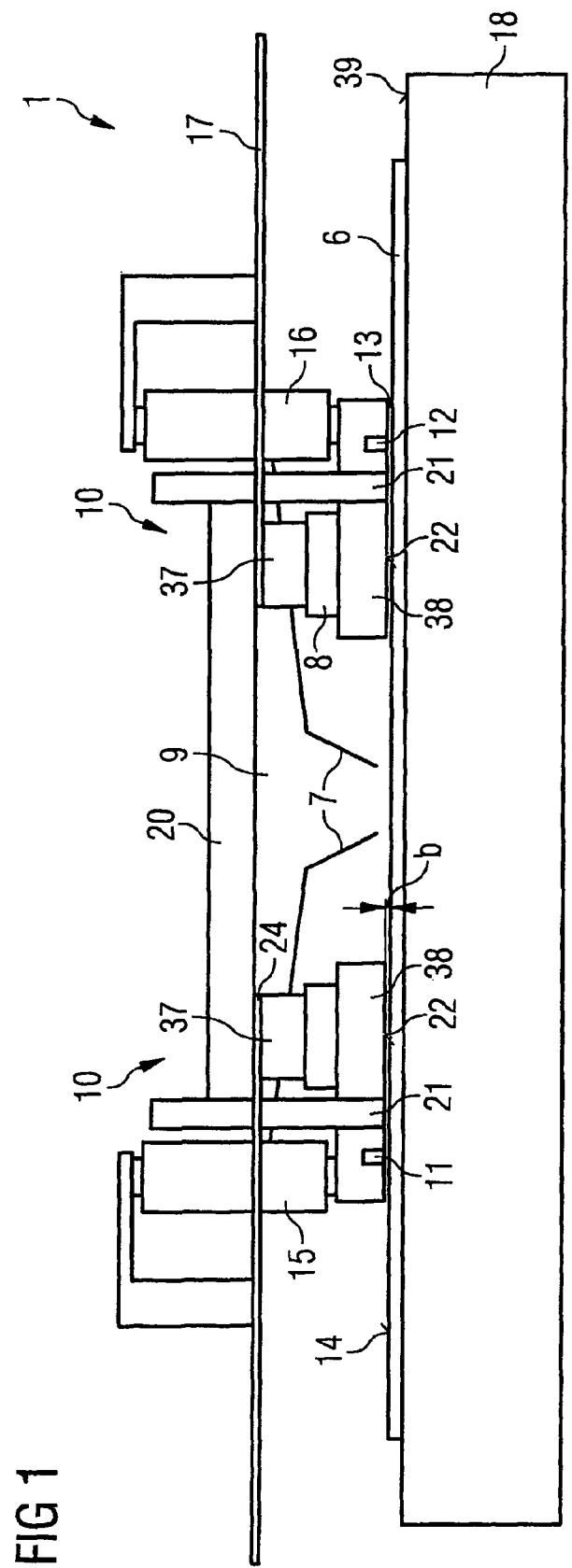
FIG. 1 shows a schematic cross section through a first embodiment of a test apparatus.

A predetermined annular gap width can be ensured which makes it possible to test semiconductor component structures in a manner which is proof against high voltages and high currents. The annular gap width is not determined primarily by pressure fluctuations in the test area.

According to an embodiment, a test apparatus is provided for semiconductor component structures on a semiconductor wafer having a needle card which holds test probes. The test probes are arranged within a test area which has a test area housing which holds the needle card. The test area has pressure applied to it, with the test housing floating on a gas cushion on the semiconductor wafer. For this purpose, the test housing has at least three distance sensors, which detect the width of a gas gap between the test area housing and a semiconductor wafer upper face. The at least three distance sensors are operatively connected to at least three gas gap control elements, with the gas gap control elements being supported against a stiff test apparatus plate. A predetermined gas gap width is maintained between the semiconductor wafer upper face and the lower face of the test area housing by the interaction between the gas gap control elements and the distance sensors. The semiconductor wafer is in this case arranged on a test table in the test apparatus.

This test apparatus has the advantage that the gas pressure that is applied to the test area protects the test region on the semiconductor wafer upper face against contamination during the test process. A further advantage is that the interaction of the distance sensors and of the gas gap control elements makes it possible to maintain a gas gap width which can be varied in steps of a few micrometers, without any risk of the test gas housing making contact with the upper face of the semiconductor wafer. Furthermore, this solution has the advantage that fluctuations in the thickness of the semiconductor wafer or curvature of the semiconductor wafer can be compensated for by the interaction of distance sensors and gas gap control elements in such a manner that a minimal gas gap width, which is optimized for its withstand voltage, can be maintained. The withstand voltage of this gas gap width is thus influenced not only by the nature of the protective gas but also by the variable distance between the semiconductor wafer upper face and the lower face of the test area housing. The withstand voltage of the gas gap must be greater than the maximum permissible test voltage that occurs for the semiconductor element structure to be tested on the semiconductor wafer.

This safe, predeterminable gas gap width which can be regulated and can be maintained makes it possible to carry out testing even in critical edge zones of power semiconductor chips, whose structures are arranged in rows and columns on the upper face of the semiconductor wafer, even though increased field strength peaks occur in particular in the edge area of semiconductor element structures such as these.

In one embodiment, the needle card is mechanically connected to the test housing via needle card control elements, which are provided in addition and independently of the gas gap control elements.

This has the advantage that the needle card can be lowered with the test probes onto the semiconductor component structures to be tested, irrespective of the setting of the gas gap width, once both rough adjustment and fine adjustment of the semiconductor element structure to be tested have been completed. Furthermore, this apparatus variant allows the test probes to make contact repeatedly in one and the same initial position. This makes it possible to achieve the advantage of automatic cleaning of the test probes as well as more controlled destruction of oxide layers when aluminum contact pads have to be tested. Finally, different test positions can also be adjusted for adjacent semiconductor element structures without having to interrupt the gas pressure supply in order to move the test probes to the next semiconductor element structure to be tested. This also makes it possible to increase the throughput for the testing of semiconductor wafers by several times in comparison to conventional test apparatuses.

Provision is also made for the test area housing to have a transparent test area covering disk for the area of the test probes. This makes it possible to test and to adjust the precise setting of the test probes with respect to the semiconductor component structure to be tested, and in the end to carry out the test, for example by use of a stereo microscope.

A further embodiment of the test apparatus provides for the test area housing to have housing walls which surround the test area. In this case, the housing wall lower faces float above the semiconductor wafer upper face, and on the gas gap that is provided. For this purpose, the housing wall lower faces may be in the form of a gas cushion ring, in order to provide a large-area annular gap for the gas flow.

The test area housing may preferably have at least one gas inlet, via which the pressure in the test area can be adjusted, and/or can be regulated in conjunction with the gas gap. For this purpose, the test area housing may have a gas pressure sensor for the test area, which is operatively connected to a gas pressure regulator. This has the advantage that the pressure in the test area can be adjusted, for example in a number of stages, via valves from a regulated pressure chamber.

The test area housing may preferably be produced to be proof against high voltages and high currents, and may preferably be produced from a plastic material.

In order to allow the gas gap width to be adjusted in the order of magnitude of micrometers, piezoelectric actuators are provided as gas gap control elements for fine adjustment. These gas gap control elements are supported on the stiff test apparatus plate in such a manner that they can adjust the gas gap width in the vertical direction. In this case, the test apparatus plate is aligned horizontally and can be moved vertically for rough adjustment. Furthermore, the test apparatus plate has a central opening, which exposes the area of the transparent test area covering disk.

The test table can preferably be aligned horizontally, to be precise in two axis directions and at least one rotation direction, in order to allow both rough adjustment and fine adjustment or setting. The test table can be adjusted roughly in the vertical direction, and the parallelity with respect to the test housing lower face can finally be initially adjusted, preferably by means of a hemispherical cup in which the test table is mounted. For fine adjustment, the gas gap width b can be adjusted in micrometers between $5\,\mu m \leq b \leq 120\,\mu m$ by means of the gas gap control elements.

In a further embodiment, the lower face of the housing wall has an annular suction groove, which is connected to a suction line in order to recover the gas emerging from the test area through the gas gap. This suction groove is arranged at the outlet of the gas gap, in which case the suction pressure and the external pressure can be matched to one another so as to recover all of the gas, as far as possible. This is particularly important when carbon dioxide or $SF_6$ is used as the protective gas, in order to preclude environmentally damaging effects of these gases. Pressure sensors are advantageously arranged in the output line and on the test housing outside the test area, for this purpose.

The annular housing wall is provided according to an embodiment to have a plurality of grooves which are arranged one behind the other in the area of its lower face, in order to reduce an anti-Bernoulli effect for the lower face of the housing walls, in order to reduce the attraction forces towards the test table and towards the semiconductor wafer.

The housing wall may preferably have an annular elastomer buffer on its lower face. This elastomer buffer is advantageous for initial adjustment and parallel alignment between the test housing lower face and the test table upper face, before the test apparatus is loaded with a semiconductor wafer. Furthermore, a buffer such as this protects the surface of the semiconductor wafer against excessive loads when emergency switch-offs occur.

A further embodiment provides for the test housing wall to have an annular groove within the test area in the region of its lower face, which annular groove is connected to the gas inlet and is designed so as to form a flow channel, which is directed obliquely upwards, in the gas gap. This embodiment is also used to reduce the suction effect of the gas gap towards the semiconductor wafer and towards the test table.

A test method using the test apparatus, as it is described above, has the following method steps. First of all, a stiff test apparatus plate with a test housing held by gas gap control elements is arranged horizontally in a test apparatus rack. The lower face of the test housing is then aligned parallel to the test table of the test apparatus. The test housing and test table are then moved apart from one another, and a semiconductor wafer with semiconductor element structures to be tested is fitted to the test table, which is now also horizontally aligned, of the test apparatus.

For testing, the test apparatus plate and the test table are moved together in the vertical direction with the semiconductor wafer and the test housing being aligned parallel, except for a predetermined safety gap between the semiconductor wafer and the lower face of the test housing for rough adjustment. The semiconductor element structures on the semiconductor wafer can now be adjusted roughly with respect to the corresponding test probes on the needle card of the test housing, by the test table being rotated about a vertical axis and being moved laterally. After this rough adjustment, a gas supply for the test area can be switched on, with a gas cushion being formed on which the test housing floats above the semiconductor wafer, and with the gas gap width being automatically regulated with the aid of distance sensors and gas gap width control elements. For this purpose, the gas gap width control elements are supported on the stiff test apparatus plate and a gas gap width is set without the test probes coming into contact with the semiconductor element structure to be tested.

The semiconductor element structure of the semiconductor wafer and the corresponding test probes on the needle card of the test housing can now be finely adjusted, once again with the test table being rotated and moved laterally. Finally, the semiconductor element structure is tested by the test probes being placed on the finely adjusted semiconductor element structure.

This method has the advantage that the high-resolution inductive or capacitive measurement system of the distance measurement sensors makes it possible to set considerably smaller gap widths reproducibly than in conventional methods. The safety distance from the semiconductor wafer is dependent only on the stiffness of the structure and the measurement resolution of the sensors. The narrow gap which can be achieved in this way allows the use of protective gases such as $SF_6$ and other highly electrically negative gases at low cost, with these gases being associated with a considerably higher breakdown resistance than air.

In one exemplary embodiment of the method, the test probes make contact with the gas gap width being reduced further by means of the gas width control elements. A simplified embodiment of the test apparatus can be used for this method, in which no additional needle card control elements are provided.

If needle card control elements such as these are provided, then the test probes can make contact with these additional and independent needle card control elements being operated, which is associated with the advantage that the minimum gas gap, once it has been set, can be maintained for all of the measurement processes on a semiconductor wafer, thus minimizing the gas consumption and the throughput time.

In a further embodiment, in addition to the mechanical maintenance of a constant gas gap width regulated by distance sensors and gas gap control elements, the pressure both within the test area and outside the test housing and, if appropriate, in a suction channel or a suction line is also checked, with different pressure differences being used between an internal pressure in the test area at different positions in the region of the gas gap and the external pressure, in order to readjust the gas gap width.

In this case, the pressure in the test area can be controlled by a positive and/or negative supply of a protective gas, or of air. Since, to a first approximation, the gas gap is independent of the pressure in the test area, pressure sensors can also be calibrated in a plurality of pressure stages. The specific combination in this method of an electrically negative gas and the variable pressure makes it possible to produce a high field strength and to precisely set the required breakdown strength with the aid of the test apparatus according to an embodiment, going well beyond the capabilities used in the past with test apparatuses such as these.

In addition, optimized protective gas suction is possible via an annular suction groove, so that the protective gas consumption can be kept very small, allowing virtually one-hundred percent recovery of the protective gas. In particular, this suction groove makes it possible to prevent environmentally hazardous gases such as $SF_6$ entering the environment.

Air, $SF_6$ and/or $CO_2$ at a pressure P of between $1.2 \times 10^5$ $Pa \leq P \leq 5 \times 10^5$ Pa can be used for the gas cushion in the test area. For this purpose, the internal pressure in the test area and the gas gap width are advantageously matched to one another such that the breakdown voltage of the gas in the gas gap is greater than the maximum test voltage which is intended to be used for the semiconductor component structure to be tested.

FIG. 1 shows a schematic cross section through a first embodiment of a test apparatus 1. The test apparatus 1 has a test table 18 on which a semiconductor wafer 6 with semiconductor element structures to be tested is arranged on its upper face 14. These semiconductor element structures are intended to be tested for their functionality even before the semiconductor wafer 6 is cut up into individual semiconductor chips. For this purpose, the test apparatus 1 has test probes 7, which are held by test probe supports 37 on an annular needle card 8. The needle card 8 is supported by a projection 38 on a housing wall 21, with the projection 38 and the housing wall 21 surrounding a test area 9 in which the test probes 7 are arranged, and which is covered at the top by a transparent test area covering disk 20, so that it is possible to carry out an adjustment process between the test probes 7 and the semiconductor element structure to be tested, on the upper face 14 of the semiconductor wafer 6, by means of a stereo microscope.

For this purpose, the test area housing 10 is supported by a stiff test apparatus plate 17, which is aligned parallel to the test table 18. During the test process, the test housing 10 is held with its lower face 22 floating above the upper face 14 of the semiconductor wafer 6 by the stiff test apparatus plate 17, which has an opening 24 in the region of the test probes 7, so that the fine adjustment of the probes 7 with respect to the upper face 14 of the semiconductor wafer 6 can be observed with the aid of the transparent test area covering disk 20.

Before and during the measurement, a minimal annular gap 13 with a gap width b is maintained between the lower face 22 of the test housing 10 and the upper face 14 of the semiconductor wafer 6 by arranging at least three distance sensors 11 and 12 on the annular projection 38 on the housing wall 21, which sensors measure the width b of the annular gap 13 and interact with annular gap control elements 15 and 16 in order to keep the annular gap width b constant. For fine adjustment, the annular gap control elements 14 and 15 have electrical actuators.

For initial or rough adjustment, either the rigid test apparatus plate 17 and/or the test table 18 can be moved towards one another or away from one another in the vertical direction while ensuring that the upper face 39 of the test table 18 and the lower face 22 of the housing wall 21 remain parallel. The test area 9 can be subjected to pressure by a protective gas, so that a gas cushion and a gas flow through the annular gap 13 protect the floating function of this non-contacting test apparatus. In order to exactly measure the distance with the aid of the at least three distance sensors 11 and 12, the distance sensors 11 and 12 have capacitive and/or inductive distance detection.

Figure 2:
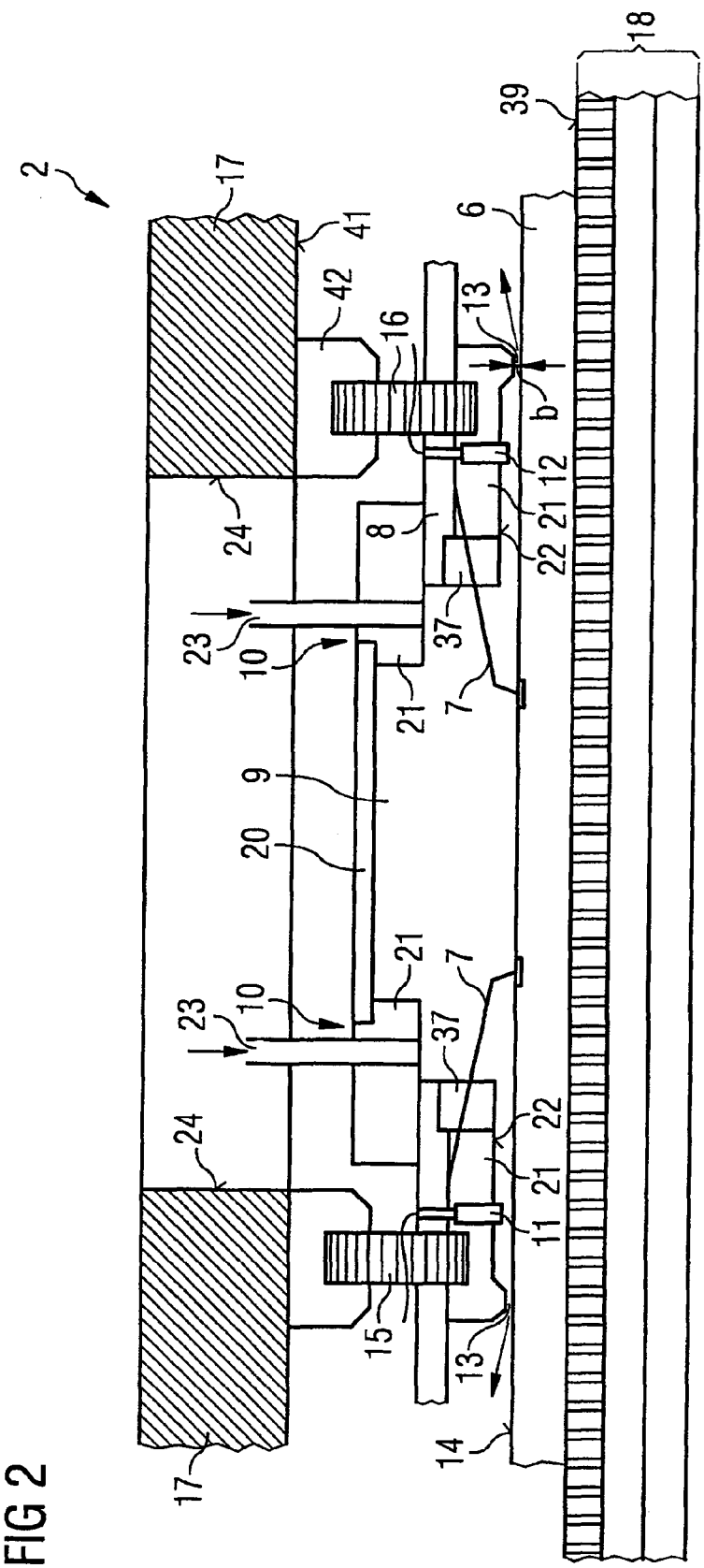
FIG. 2 shows a schematic cross section through a second embodiment of a test apparatus.

FIG. 2 shows a schematic cross section through a second embodiment of a test apparatus 2. Components having the same functions as in FIG. 1 are identified by the same reference symbols, and will not be explained again. In this case as well, the test probes 7 are arranged in a test area 9, which is closed at the top by a transparent test area covering disk 20. The test area is surrounded by a test area housing 10, to which the transparent test area covering disk 20 belongs and which furthermore has housing walls 21 which are composed of a plurality of components with annular openings. The solid and stiff test apparatus plate 17 also has an opening 24, through which the housing 10 can be accessed.

In the edge area of this opening 24, holders 42 are distributed on the circumference on the lower face 41 of the test apparatus plate and fix the annular gap control elements 15 and 16, which have piezoelectric actuators for this purpose. These actuators 15 and 16 support the test housing 21, with the distance sensors 11 and 12 being arranged on the lower face 22 of the housing wall 21 and ensuring that the gap width b of the gap 13 is kept constant. A gas pressure is built up in the test area 9 via the gas inlets 23 and causes a gas flow in the gap 13 so that, in addition to the active distance regulation by the distance sensors 11 and 12, the gap width b is kept constant by interaction with the gap control elements 15 and 16. The accuracy and size of the gap width b depend on the measurement accuracy of the distance sensors 11 and 12 and on the adjustment accuracy of the gap control elements 15 and 16. Since these gap control elements 15 and 16 have piezoelectric actuators for this purpose, gap widths b can also be maintained in micrometers in the range between $5 \mu m \leq b \leq 120 \mu m$.

Furthermore, this second embodiment differs from the embodiment shown in FIG. 1 in that the test probe supports 37 together with the test probes 7 are arranged underneath the needle card 8. Furthermore, the lower face 23 of the housing walls 21 is designed so as to achieve an anti-Bernoulli effect, thus minimizing the suction forces on the upper face 14 of the semiconductor wafer 6.

Figure 3:
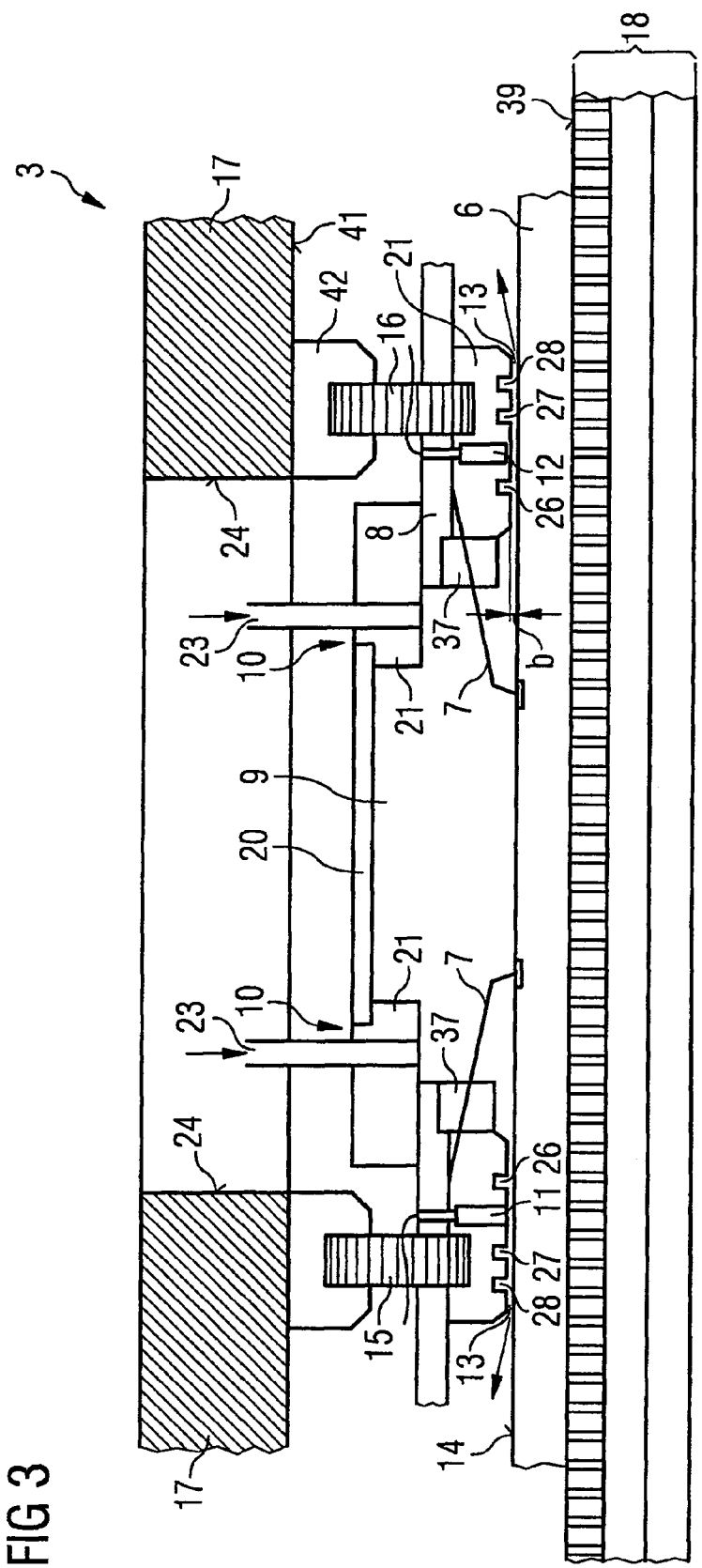
FIG. 3 shows a schematic cross section through a third embodiment of a test apparatus.

FIG. 3 shows a schematic cross section through a third embodiment of a test apparatus 3. Components having the same functions as in the previous figures are identified by the same reference symbols, and will not be explained again. The difference from the previous embodiment shown in FIG. 2 is that the lower face 22 is structured by a plurality of annular grooves 26, 27 and 28, in order to improve the sealing effect of the gap 13 while at the same time reducing the gas consumption and further preventing the suction effect on the upper face 14 of the semiconductor wafer 6 in the direction of the housing lower face 22.

Figure 4:
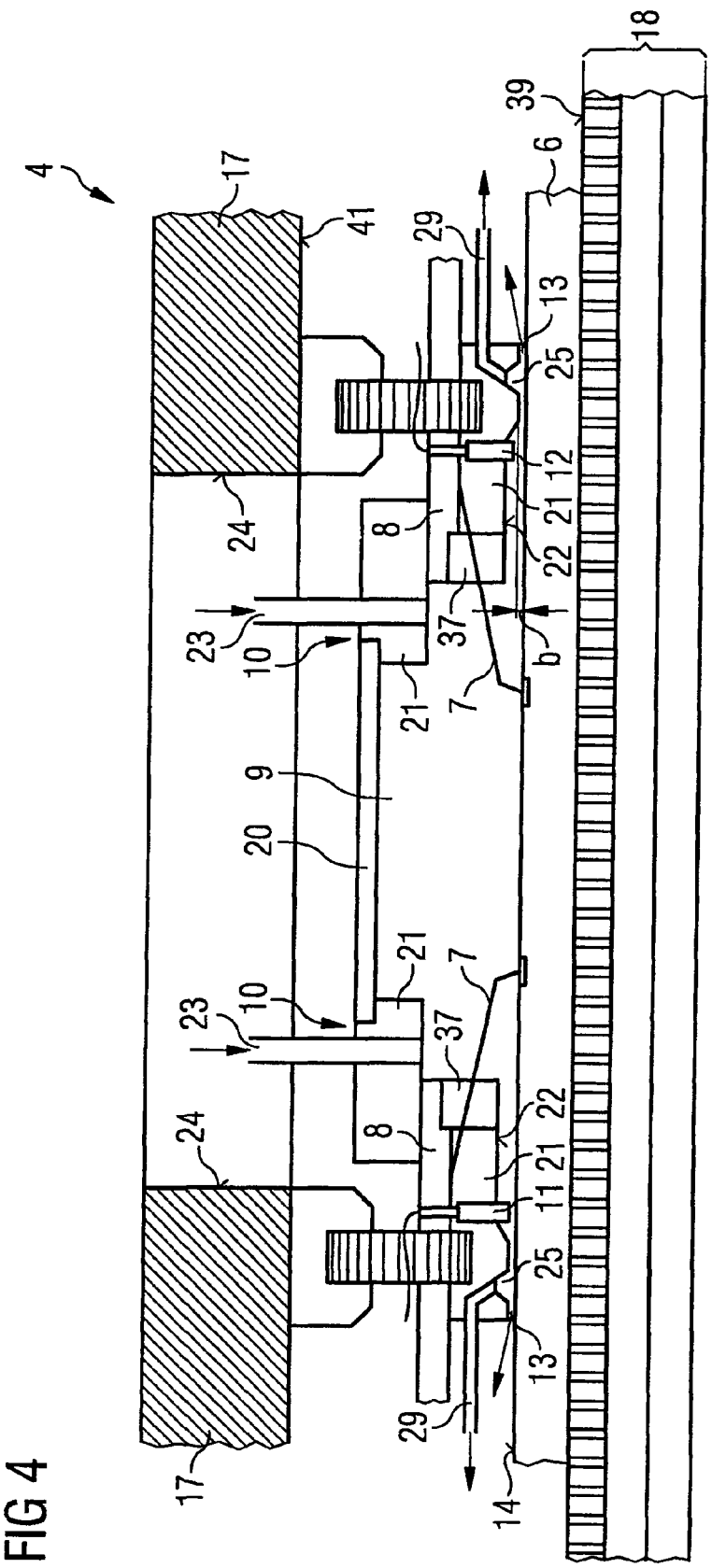
FIG. 4 shows a schematic cross section through a fourth embodiment of a test apparatus.

FIG. 4 shows a schematic cross section through a fourth embodiment of the test apparatus 4. Components having the same functions as in the previous figures are identified by the same reference symbols, and will not be explained again. In contrast to the previous embodiments, this fourth embodiment has an outer suction groove 25, which is arranged downstream in the gap 13 and can suck out up to one hundred percent of the protective gas via a downstream exhaust gas line 29, and can supply this back to the system again. The pressure difference between the exhaust gas line 29 and the external pressure is measured for this purpose in order to ensure that the suction annular groove 25 receives all of the protective gas.

Furthermore, this pressure-difference measurement can be used, if it is carried out at a plurality of points in the exhaust gas groove 25, to provide a further control variable for readjustment of the gap control elements 15 and 16. The gas cushion in the test area 9 of the test apparatus 4 can be preferably kept at a gas pressure P between $1.2 \times 10^5 Pa \leq P \leq 2$ Pa. Since, to a first approximation, the gap width b can be set independently of the gas pressure P in the test area 9 by means of the gap control elements 15 and 16, a different gas pressure can be calibrated in the test area 9. The suction groove 25 in conjunction with the suction line 29 also makes it possible to use even environmentally hazardous gases with a high breakdown strength, such as $SF_6$ or other highly negative gases, for measurement purposes.

FIG. 5 shows a schematic cross section through a fifth embodiment of a test apparatus 5. This fifth embodiment differs from the previous embodiments in that the test probe supports 37 are equipped with needle card control elements 19 independently of the gap control elements 15 and 16, so that the test probes 7 can make contact and can be lifted off while the various semiconductor element structures are being found on the upper face 14 of the semiconductor wafer 6, thus shortening the test time per semiconductor wafer, since the gas cushion can be maintained throughout the entire series of measurements in the test area 9. In addition, it is also possible for the test probes 7 to make contact repeatedly at one and the same position, in order, for example in the case of aluminum test surfaces, to penetrate through the inherent aluminum oxide, and/or to clean the test probes 7 by them making contact repeatedly.

FIG. 6 shows a schematic cross section through a conventional test apparatus 40, as has already been described in detail in the introduction above.

LIST OF REFERENCE SYMBOLS

1 Test apparatus (1st embodiment)
2 Test apparatus (2nd embodiment)
3 Test apparatus (3rd embodiment)
4 Test apparatus (4th embodiment)
5 Test apparatus (5th embodiment)
6 Semiconductor wafer
7 Test probe
8 Needle card
9 Test area
10 Test area housing
11 Distance sensor
12 Distance sensor
13 Gas gap or annular gap
14 Semiconductor wafer upper face
15 Gas gap control element or annular gap control element
16 Gas gap control element or annular gap control element
17 Test apparatus plate
18 Test table
19 Needle card control element
20 Test area covering disk
21 Housing wall
22 Lower face
23 Gas inlet
24 Central opening in the test apparatus plate 25 Suction groove
26 Groove
27 Groove
28 Groove
29 Suction line
30 Spring element
31 Gas cushion ring
32 Supporting element
33 Supporting element
34 Test apparatus frame
35 Lower face of the gas cushion ring
36 Annular groove
37 Test probe support
38 Projection
39 Upper face of the test table
40 Conventional Test apparatus
41 Lower face of the test apparatus plate
42 Holder
b Gas gap width

What is claimed is:

1. A test apparatus for semiconductor element structures on a semiconductor wafer, comprising a needle card which holds test probes within a test area located within a test area housing holding the needle card, wherein the test area is pressurized such that the test area housing floats on a gas cushion on the semiconductor wafer, wherein the test area housing comprises at least three distance sensors which detect the width of a gap between the test area housing and a semiconductor wafer upper face, and interact with at least three gap control elements, which are supported against a stiff test apparatus plate and maintain a predetermined gap width, and wherein the semiconductor wafer is arranged on a test table of the test apparatus.

2. The test apparatus according to claim 1, wherein the needle card is mechanically connected to the test area housing via needle card control elements.

3. The test apparatus according to claim 2, wherein the test area housing has a transparent test area covering disk for the area of the test probes.

4. The test apparatus according to claim 3, wherein the test apparatus plate is horizontally aligned and can be moved vertically, and has a central opening in the area of the transparent test area covering disk.

5. The test apparatus according to claim 2, wherein the needle card control elements have piezoelectric actuators.

6. The method according to claim 5, wherein different pressure differences are used between an internal pressure in the test area at different positions in the area of the gap and the external pressure, in order to readjust the gap width.

7. The method according to claim 5, wherein air, $SF_6$ and/or $CO_2$ at a pressure P of between $1.2 \times 10^5$ Pa$\leq$P$\leq$$5 \times 10^5$ Pa are used for the gas cushion in the test area.

8. The method according to claim 5, wherein the pressure difference between the external pressure and the pressure in at least one suction line is measured, and is adjusted such that the gas which is flowing through the gap is not emitted to the surrounding area.

9. The method according to claim 5, wherein the internal pressure in the test area and the gap width are matched to one another in such a manner that the breakdown voltage of the gas in the gap is greater than the maximum test voltage which can be used for the semiconductor element structure to be tested.

10. The test apparatus according to claim 1, wherein the test area housing has a housing wall which surrounds the test area and whose housing wall lower face floats above the semiconductor wafer upper face and the gap.

11. The test apparatus according to claim 1, wherein the test area housing has at least one gas inlet.

12. The test apparatus according to claim 1, wherein the test area housing has a gas pressure sensor for the test area, which is operatively connected to a gas pressure regulator.

13. The test apparatus according to claim 1, wherein the test area housing is resistant to high voltages and high currents.

14. The test apparatus according to claim 1, wherein the gap control elements have piezoelectric actuators.

15. The test apparatus according to claim 1, wherein the test table can be aligned horizontally and can be moved in two axis directions and in a rotation direction, arranged horizontally.

16. The test apparatus according to claim 1, wherein the gap width can be adjusted in micrometers between $5\mu m \leq b \leq 120 \mu m$ by means of the gap control elements.

17. The test apparatus according to claim 1, wherein the housing wall has an annular suction groove in the area of its housing wall lower face, which suction groove is connected to a suction line in order to recover the gas emerging from the test area through the gap.

18. The test apparatus according to claim 1, wherein the housing wall has a plurality of grooves, arranged one behind the other, in the area of its lower face.

19. The test apparatus according to claim 1, wherein the housing wall has an annular elastomer buffer in the area of its lower face.

20. The test apparatus according to claim 1, wherein pressure sensors are arranged in the suction line and on the test housing, outside the test area.

21. The test apparatus according to claim 1, wherein the housing wall has an annular groove in the area of its lower face, within the test area, which annular groove is connected to the gas inlet and is designed in such a manner that a flow channel, which is directed obliquely outwards, is formed in the gap.

22. A test method using the test apparatus according to claims 1, wherein the method comprises the following method steps:
    arranging a stiff test apparatus plate with a test housing which is held by gap control elements horizontally in a test apparatus rack;
    applying a semiconductor wafer with semiconductor element structures to be tested to a horizontally aligned test table of the test apparatus;
    moving the test apparatus plate and the test table vertically towards one another, wherein the semiconductor wafer and the test housing being aligned parallel except for a predetermined safety gap between the semiconductor wafer and the test housing for rough adjustment;
    roughly adjusting one of the semiconductor element structures of the semiconductor wafer and the corresponding test probes of the needle card of the test housing, wherein the test table being rotated and moved laterally;
    switching the gas supply for the test area on, forming a gas cushion in which the test housing, which floats above the semiconductor wafer, automatic gap width regulation is switched on with the aid of distance sensors and gap width control elements, which are supported on the stiff test apparatus plate, to a gap width, without the test probes making contact;
    finely adjusting the semiconductor element structure of the semiconductor wafer and the corresponding test probes of the needle card of the test housing, wherein the test table being rotated and moved laterally;

testing the finely-adjusted semiconductor element structure, wherein the test points being placed on the semiconductor element structures to be tested.

23. The method according to claim 22, wherein the test probes make contact, wherein the gap width is reduced further by means of the gap width control elements.

24. The method according to claim 22, wherein the test probes make contact, with additional, independent needle card control elements being operated.

* * * * *